United States Patent
Chandrasekaran et al.

(10) Patent No.: US 8,391,018 B2
(45) Date of Patent: Mar. 5, 2013

(54) SEMICONDUCTOR DIE-BASED PACKAGING INTERCONNECT

(75) Inventors: Arvind Chandrasekaran, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 411 days.

(21) Appl. No.: 12/567,982

(22) Filed: Sep. 28, 2009

(65) Prior Publication Data
US 2011/0075393 A1    Mar. 31, 2011

(51) Int. Cl.
*H05K 1/11* (2006.01)

(52) U.S. Cl. ........ 361/790; 361/760; 361/792; 361/809; 361/803

(58) Field of Classification Search .................. 361/760, 361/790, 792, 807, 809, 811, 803, 729, 736, 361/748; 174/262
See application file for complete search history.

(56) References Cited

U.S. PATENT DOCUMENTS

| | | | |
|---|---|---|---|
| 7,209,366 B2 * | 4/2007 | Prokofiev et al. | 361/803 |
| 7,609,501 B2 * | 10/2009 | Anthony et al. | 361/118 |
| 7,911,802 B2 * | 3/2011 | Kawano et al. | 361/763 |
| 8,072,333 B2 * | 12/2011 | Ferguson et al. | 340/572.7 |
| 2004/0047104 A1 * | 3/2004 | Takahara et al. | 361/118 |
| 2004/0124511 A1 * | 7/2004 | Li | 257/678 |
| 2005/0141206 A1 * | 6/2005 | Radhakrishnan et al. | 361/782 |
| 2005/0189636 A1 * | 9/2005 | Savastiouk et al. | 257/678 |
| 2006/0079079 A1 | 4/2006 | Muthukumar et al. | |
| 2007/0081314 A1 * | 4/2007 | Nakatani | 361/783 |
| 2008/0017407 A1 * | 1/2008 | Kawano | 174/260 |
| 2008/0018350 A1 * | 1/2008 | Chao et al. | 324/754 |
| 2008/0213933 A1 * | 9/2008 | Fisher et al. | 438/48 |
| 2008/0303159 A1 * | 12/2008 | Muthukumar et al. | 257/758 |
| 2008/0309349 A1 * | 12/2008 | Sutono | 324/537 |
| 2009/0075478 A1 * | 3/2009 | Matsui | 438/667 |
| 2009/0268422 A1 * | 10/2009 | Bailey et al. | 361/803 |
| 2010/0126000 A1 * | 5/2010 | Forster | 29/601 |
| 2011/0031598 A1 * | 2/2011 | Lee et al. | 257/686 |
| 2011/0043105 A1 * | 2/2011 | Cok et al. | 313/506 |

FOREIGN PATENT DOCUMENTS

| | | |
|---|---|---|
| DE | 102006053461 | 5/2008 |
| EP | 1137067 | 9/2001 |

OTHER PUBLICATIONS

International Search Report—PCT/ US2010/050384, International Search Authority—European Patent Office Nov. 30, 2010.
Written Opinion—PCT/ US2010/050384, International Search Authority—European Patent Office Nov. 30, 2010.

* cited by examiner

*Primary Examiner* — Hoa C Nguyen
(74) *Attorney, Agent, or Firm* — Michelle Gallardo; Nicholas J. Pauley; Jonathan T. Velasco

(57) ABSTRACT

An electronic system includes a system board and a packaging substrate mounted on the system board. One or more semiconductor dies are mounted on the packaging substrate and coupled to the system board. The system also includes one or more semiconductor die-based packaging interconnects between the system board and the packaging substrate. The semiconductor die-based packaging interconnect has a first face coupled to the system board and a second face coupled to the packaging substrate. Through silicon vias located in the semiconductor die-based packaging interconnect enable communication between the system board and the one or more semiconductor dies. The semiconductor die-based packaging interconnects may include passive devices, active devices, and/or circuitry. For example, the semiconductor die-based packaging interconnect may provide impedance matching, decoupling capacitance, and/or amplifiers for minimizing insertion loss.

16 Claims, 8 Drawing Sheets

SEMICONDUCTOR DIE-BASED PACKAGING INTERCONNECT

TECHNICAL FIELD

The present disclosure generally relates to microelectronics packaging. More specifically, the present disclosure relates to semiconductor components interconnecting a package to a system board.

BACKGROUND

Many applications employ out-of-system components. For example, an integrated circuit (IC) may be coupled with impedance matching elements, decoupling capacitors, integrated capacitors, or other peripherals, such as microelectromechanical systems (MEMS). These components conventionally are located external to the main package and thus consume additional area or space on the system board or elsewhere. For example, these components may be provided on top of a die resulting in an increase of overall package height, or side by side with the die resulting in an increase of package area. Although components may be embedded within a packaging substrate or mounted on the packaging substrate, additional complexities result. For example, routing to avoid the embedded/mounted component becomes an issue. Moreover, embedded components are difficult to test.

Thus, there is a need to bring such external components into the package itself.

SUMMARY

According to an aspect of the present disclosure, an electronic system includes a system board. The electronic system also includes a packaging substrate mounted on the system board. The electronic system further includes at least one semiconductor die mounted on the packaging substrate. The semiconductor die(s) communicates with the packaging substrate. The electronic system also includes at least one semiconductor die-based packaging interconnect between the system board and the packaging substrate. The semiconductor die-based packaging interconnect(s) are coupled to the system board and the packaging substrate to enable communication between the system board and the packaging substrate According to another aspect of the present disclosure, a process for manufacturing an electronic system includes depositing a packaging connection on a packaging substrate. The process also includes depositing at least one semiconductor die-based packaging interconnect adjacent to the packaging connection. The process also includes coupling a semiconductor die to the packaging substrate with the packaging connection and the semiconductor die-based packaging interconnect(s).

According to yet another aspect of the present disclosure, a semiconductor packaging system includes a system board. The semiconductor packaging system also includes a packaging substrate mounted on the system board. The semiconductor packaging system further includes a packaging connection coupling the system board and the packaging substrate. The semiconductor packaging system yet also includes means for interconnecting the packaging substrate and the system board adjacent to the packaging connection.

The foregoing has outlined rather broadly the features and technical advantages of the present invention in order that the detailed description that follows may be better understood. Additional features and advantages will be described hereinafter which form the subject of the claims of the invention. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the technology of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following description taken in conjunction with the accompanying drawings.

DETAILED DESCRIPTION

A semiconductor die-based packaging connection enables an accessory, peripheral system or peripheral element from the semiconductor system to be incorporated into a packaged IC. A semiconductor die is assembled using, for example, surface mount technology (SMT) to mount the packaging connection. The semiconductor die has two faces: one face attaches to the packaging substrate, and one face attaches to the system board. When the entire component or die assembly is placed onto the system and reflowed, between the packaging substrate and the system board become coupled.

The semiconductor die packaging connection reduces the area required by the system by removing external components. Inductance or other transmission line losses are reduced by locating the external element closer to the packaging substrate. Finally, a more direct coupling is established between the packaging substrate and the system board. In different embodiments, the semiconductor die packaging connection may include, integrated passive devices (IPD), integrated passive and active devices (IPAD), microelectromechanical systems (MEMS), or other devices and circuitry.

Figure 1A:
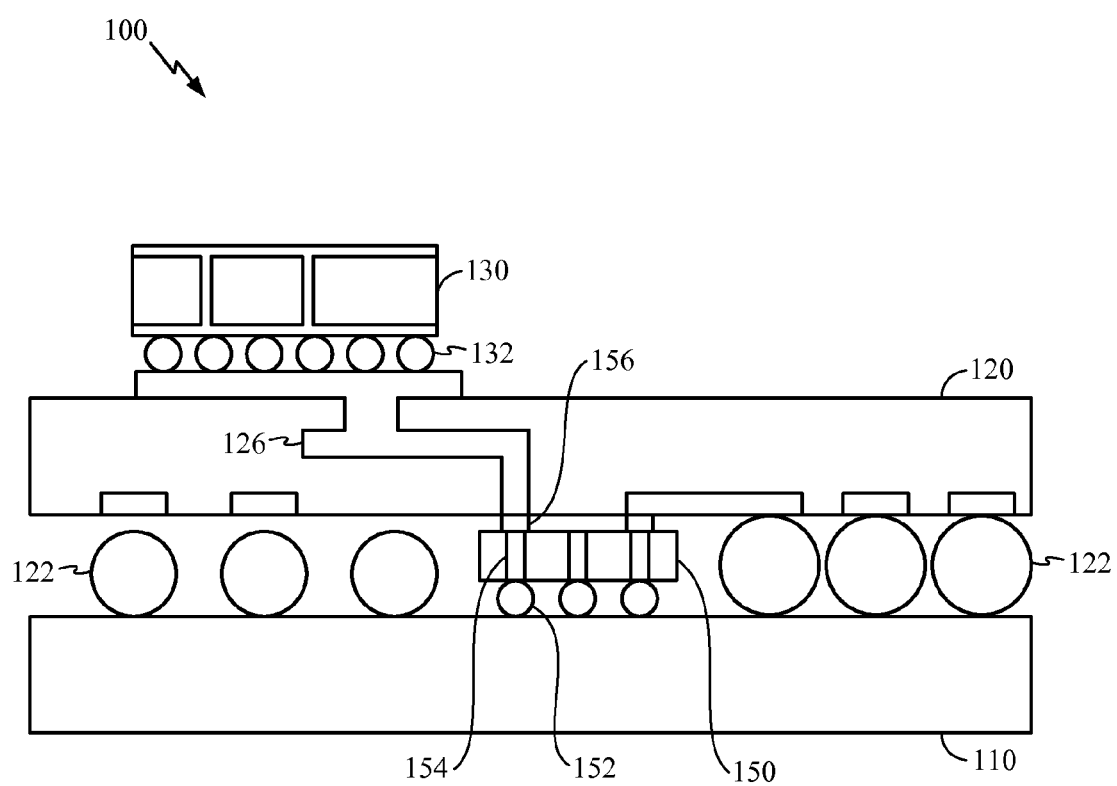
FIG. 1A is a cross-sectional view of an exemplary packaged IC having a semiconductor die-based packaging connection according to one embodiment of the disclosure.

A semiconductor die-based packaging connection will now be described with reference to FIGS. 1A-1C. FIG. 1A is a cross-sectional view of an exemplary packaged IC having a semiconductor die-based packaging connection according to one embodiment of the disclosure. A packaged IC 100 includes a system board 110. A packaging substrate 120 is coupled to the system board 110 through a packaging connection such as, for example, balls 122 of a ball grid array. In one embodiment, the size of the balls 122 may be approximately 300 microns. A fraction of the balls 122 may be depopulated to incorporate a semiconductor die-based packaging connection 150. The height of the semiconductor die-based packaging connection 150 may be 50-300 microns allowing placement between the packaging substrate 120 and the system board 110.

The semiconductor die-based packaging connection 150 includes through silicon vias 154 manufactured through, for example, a via first or via last process. A via last process may be used to reduce cost if a low aspect ratio of the through silicon vias 154 is desired. The through silicon vias 154 couple a packaging connection 152 to a packaging connection 156. The packaging connection 156 couples to the packaging connection 132 through interconnects 126 in the packaging substrate 120. The semiconductor die 130 is mounted on the packaging substrate 120 with the packaging connection 132. An electrical path exists from the system board 110 to the semiconductor die 130 through the packaging connection 132, the interconnects 126, the packaging connection 156, the semiconductor die-based packaging connection 150, and the packaging connection 152. The electrical path enables communication between circuitry in the semiconductor die 130 and circuitry in or coupled to the system board 110.

A manufacturing process for placing on package elements (OPE) such as the semiconductor die-based packaging connection 150 may include, for example, altering a ball drop process for the balls 122 or adding an additional process after the ball drop process for the balls 122.

According to one embodiment of a manufacturing process including OPEs, the ball drop process is modified. During the final processes of package assembly a ball drop process takes balls 122 and drops the balls 122 onto the packaging substrate 120. During the ball drop process, OPEs may be dropped on the packaging substrate 120 in place of a fraction of the balls 122. After the ball drop process and OPE placement, reflow and/or underfill may be applied to the packaged IC 100.

According to another embodiment of a manufacturing process including OPEs, a separate process may be used to place the OPEs on the packaging substrate 120. After a ball drop process completes, the packaged IC 100 proceeds to a pick and place process. The pick and place process selects OPEs such as the semiconductor die-based packaging connection 150 and places the OPEs on the packaging substrate 120 adjacent to the balls 122. The pick and place process is configured to pick the OPEs in such a way as to prevent damage to either side of the OPE.

Processing of the semiconductor die 130 and the semiconductor die-based packaging connection 150 will now be described with reference to FIGS. 1B and 1C, respectively.

Figure 1B:
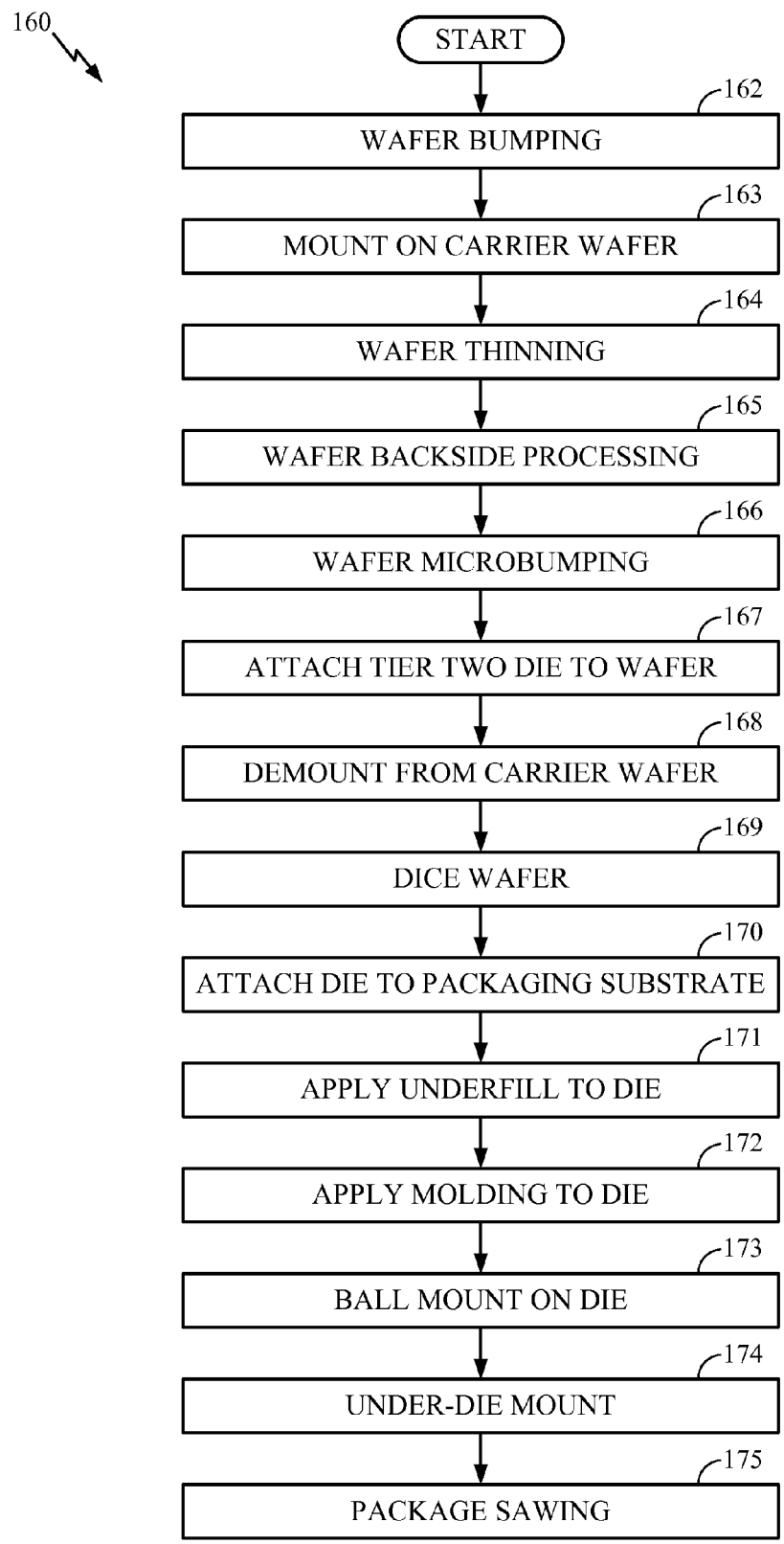
FIG. 1B is a flow chart illustrating a process flow for the semiconductor die according to one embodiment of the disclosure.

FIG. 1B is a flow chart illustrating a manufacturing process flow for the semiconductor die 130 on top of the packaging substrate 120, according to one embodiment of the disclosure. A flow chart 160 begins at block 162 with bumping of a semiconductor wafer. In the case of a 3d IC, the semiconductor wafer is mounted on a carrier wafer at block 163. At block 164 the semiconductor wafer is thinned followed by backside processing at block 165. Microbumping on one face of the semiconductor wafer occurs at block 166. A second tier die may be attached to the semiconductor wafer at block 167. At block 168 the carrier wafer is demounted from the semiconductor wafer followed by dicing into semiconductor dies at block 169.

The semiconductor die is attached to a packaging substrate at block 170 and underfill is applied at block 171. Molding is applied to the semiconductor die at block 172. A ball mount occurs at block 173 followed by under-die mount at block 174 and package sawing at block 175. It is noted that blocks 163-168 are applicable when a 3D IC is to be created, i.e., another die (e.g., second tier) is stacked on the semiconductor die 130.

Figure 1C:
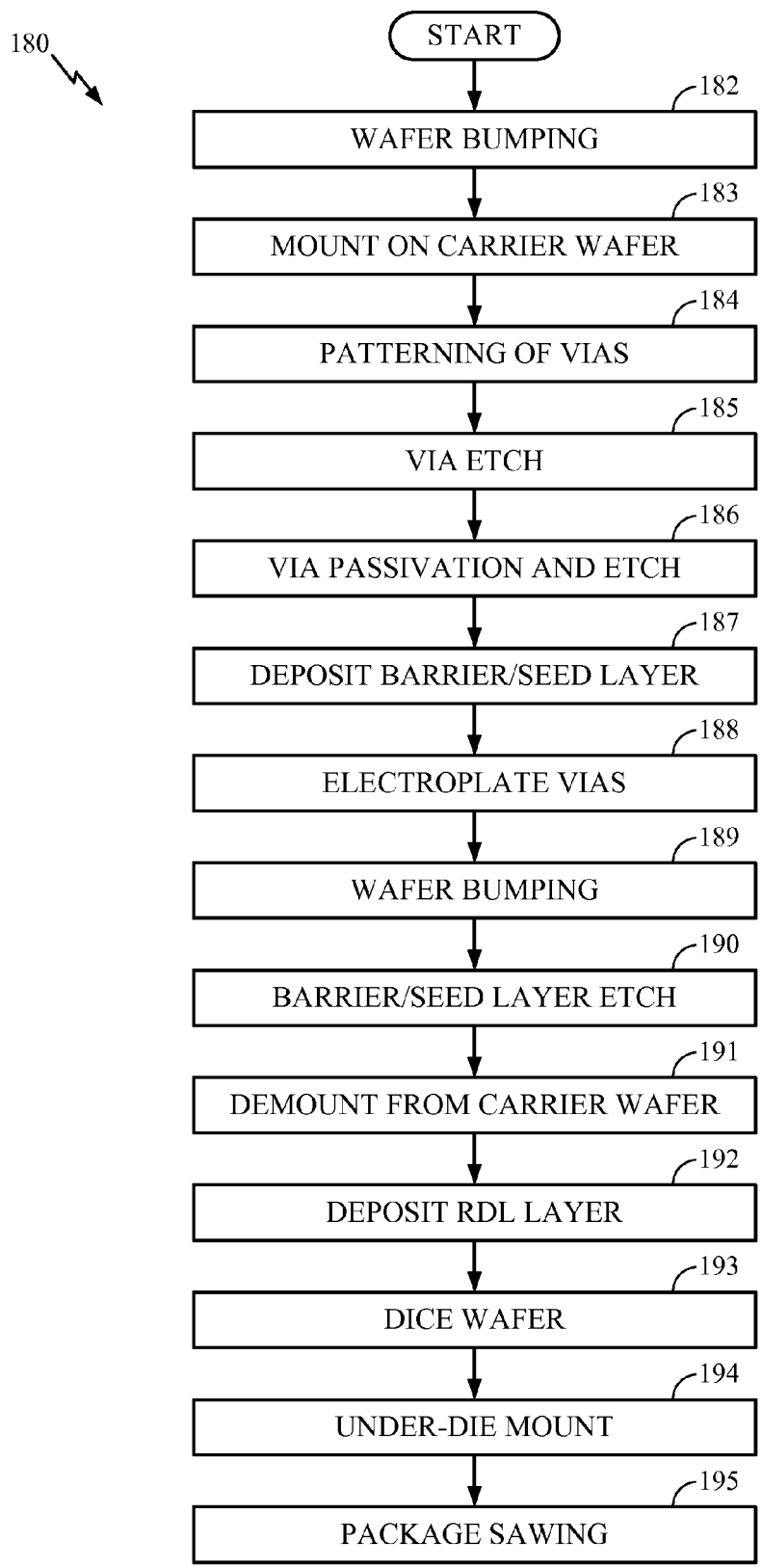
FIG. 1C is a flow chart illustrating a process flow for the semiconductor die package interconnect according to one embodiment of the disclosure.

FIG. 1C is a flow chart illustrating a manufacturing process flow for the semiconductor die-based packaging connection 150 according to one embodiment of the disclosure. A flow chart 180 begins with bumping of a semiconductor wafer at block 182. The semiconductor wafer is mounted on a carrier wafer at block 183 followed by patterning of vias at block 184 and etching of vias at block 185. At block 186 the vias are passivated and etched further. A barrier/seed layer is deposited at block 187 and the vias are plated at block 188. Microbumping of the semiconductor wafer occurs at block 189 followed by an etch of the seed/barrier layer at block 190. The carrier is demounted at block 191 followed by deposition of a redistribution layer (RDL) at block 192. The semiconductor wafer is diced into semiconductor dies at block 193 followed by an under-die mount at block 194 and package sawing at block 195.

The semiconductor die-based packaging connection 150 may be implemented to locate external components closer to circuitry in the semiconductor die 130 or provide additional functionality to the packaged IC 100. For example, the semiconductor die-based packaging connection 150 may be implemented in impedance matching, voltage regulation, I/O buffering, or other functions. Additional embodiments of the semiconductor die-based packaging connection 150 will now be discussed.

Figure 2:
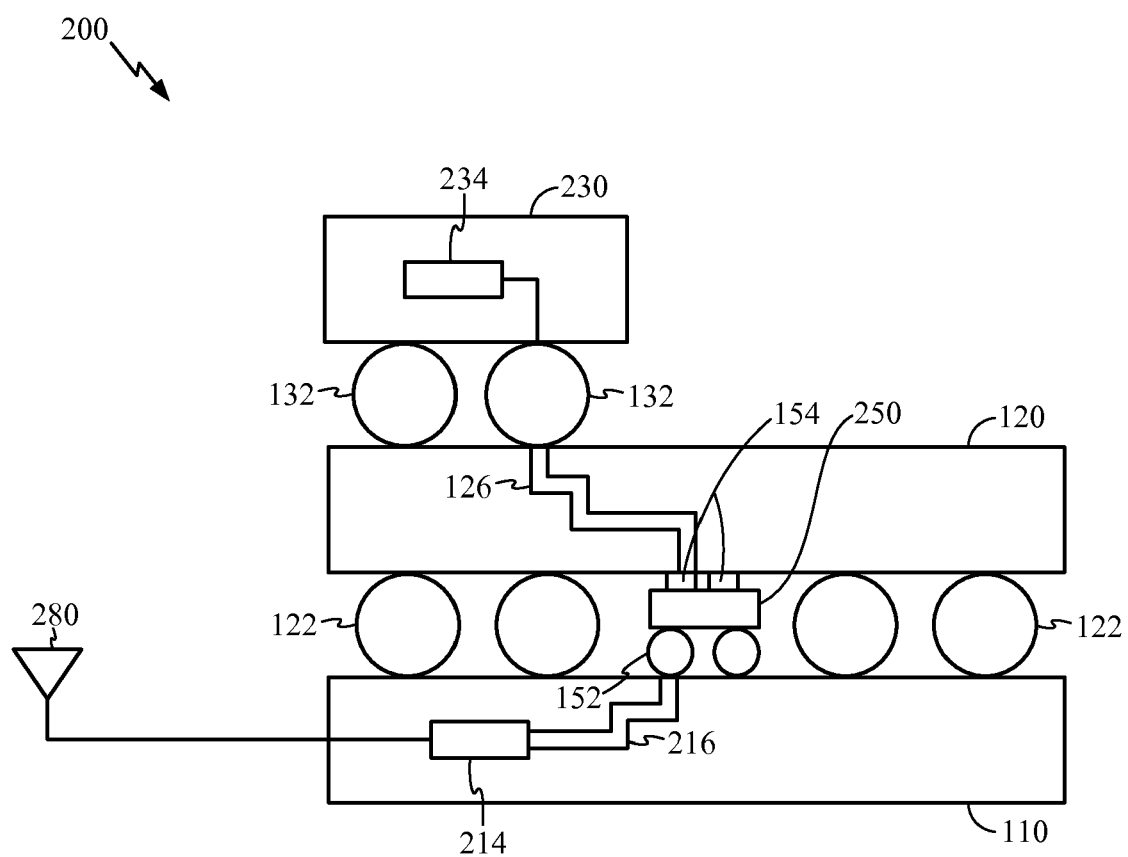
FIG. 2 is a cross-sectional view of an exemplary packaged IC having a semiconductor die-based packaging connection as an impedance matching circuit according to one embodiment of the disclosure.

FIG. 2 is a cross-sectional view of an exemplary packaged IC having a semiconductor die-based packaging connection as an impedance matching circuit according to one embodiment of the disclosure. An IC 200 includes an RF circuit 214 embedded in or coupled to the system board 110. An antenna 280 is coupled to the RF circuit 214. The RF circuit 214 is coupled through interconnects 216 and the packaging connection 152 to a semiconductor die-based packaging connection 250. In this embodiment, the semiconductor die-based packaging connection 250 includes impedance matching circuitry for matching the impedance Z1, of the RF circuit 214, and the impedance Z2, of an RF circuit 234 located in a die 230. For example, the semiconductor die-based packaging connection 250 may include IPADs. The die 230 is coupled to the packaging substrate 120 through the packaging connection 132. An electrical path is formed between the RF circuit 234 and the semiconductor die-based packaging connection 250 through the interconnects 126. Locating the impedance matching circuit close to the RF circuits 214, 234 reduces challenges with matching arising from the additional inductance and capacitance associated with interconnects to couple to external impedance matching circuitry.

Figure 3A:
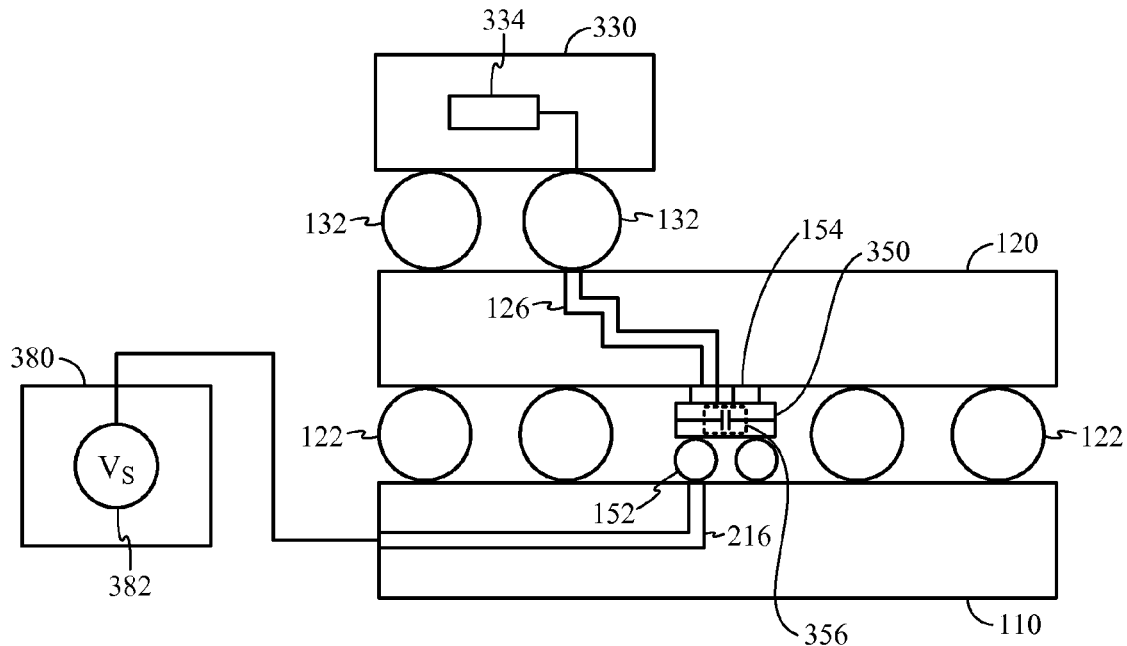
FIG. 3A is a cross-sectional view of an exemplary packaged IC having a semiconductor die-based packaging connection as a decoupling capacitor according to one embodiment of the disclosure.

In another embodiment, a semiconductor die-based packaging connection may be used for voltage regulation. FIG. 3A is a cross-sectional view of an exemplary packaged IC having a semiconductor die-based packaging connection as a decoupling capacitor according to one embodiment of the disclosure. In this embodiment, an external component 380 such as a voltage supply 382 may be coupled to the system board 110. An interconnect 216 and the packaging connection 152 couple the voltage supply 382 to a semiconductor die-based packaging connection 350. The voltage supply 382 supplies power for circuit 334 in a die 330 coupled to the packaging substrate 120 through the packaging connection 132 and interconnect 126.

The semiconductor die-based packaging connection 350 includes decoupling capacitors 356 for regulating voltage from the voltage supply 382 to the circuit 334. The decoupling capacitors 356 provide capacitance in order to provide substantially instantaneous current to the circuit 334 and reduce the voltage drop between the voltage supply 382 and the circuit 334. Locating the decoupling capacitors 356 close to the circuit 334 enables a rapid response from the decoupling capacitors 356 as illustrated in the equivalent circuit below.

Figure 3B:
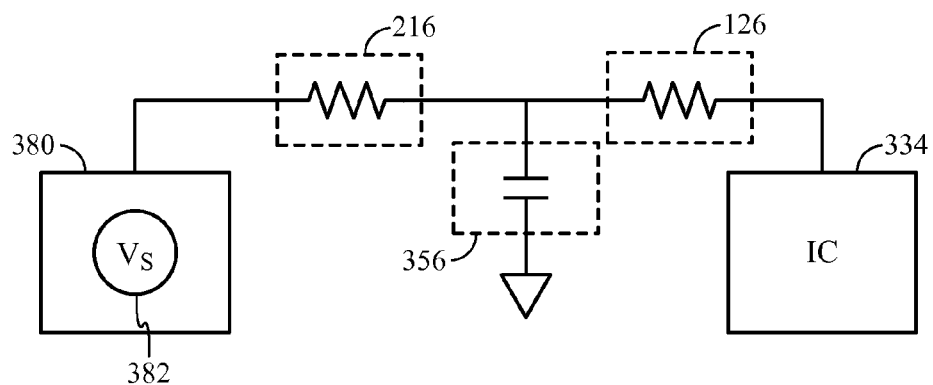
FIG. 3B is an equivalent circuit of an exemplary packaged IC having a semiconductor die-based packaging connection e as a decoupling capacitor according to one embodiment.

FIG. 3B is an equivalent circuit of an exemplary packaged IC having a semiconductor die-based packaging connection as a decoupling capacitor according to one embodiment. The voltage supply 382 is coupled to the circuit 334 to provide supply voltage and enable operation of the circuit 334. Electrical paths, such as the interconnect 216, between the decoupling capacitor 356 and the voltage supply 382, and the interconnect 126, between the decoupling capacitor 356 and the circuit 334 act as a resistance to voltage supply 382. A voltage drop occurs across the interconnect 126, which reduces the voltage provided to the circuit 334 from the decoupling capacitor 356 due to unmet instantaneous current demand. Locating the decoupling capacitor closer to the circuit 334 shortens the interconnect 126 and reduces the resistance of the interconnect 126. Thus, the voltage drop across interconnect 126 is reduced during unmet instantaneous current demand on the voltage supply 382

Figure 4:
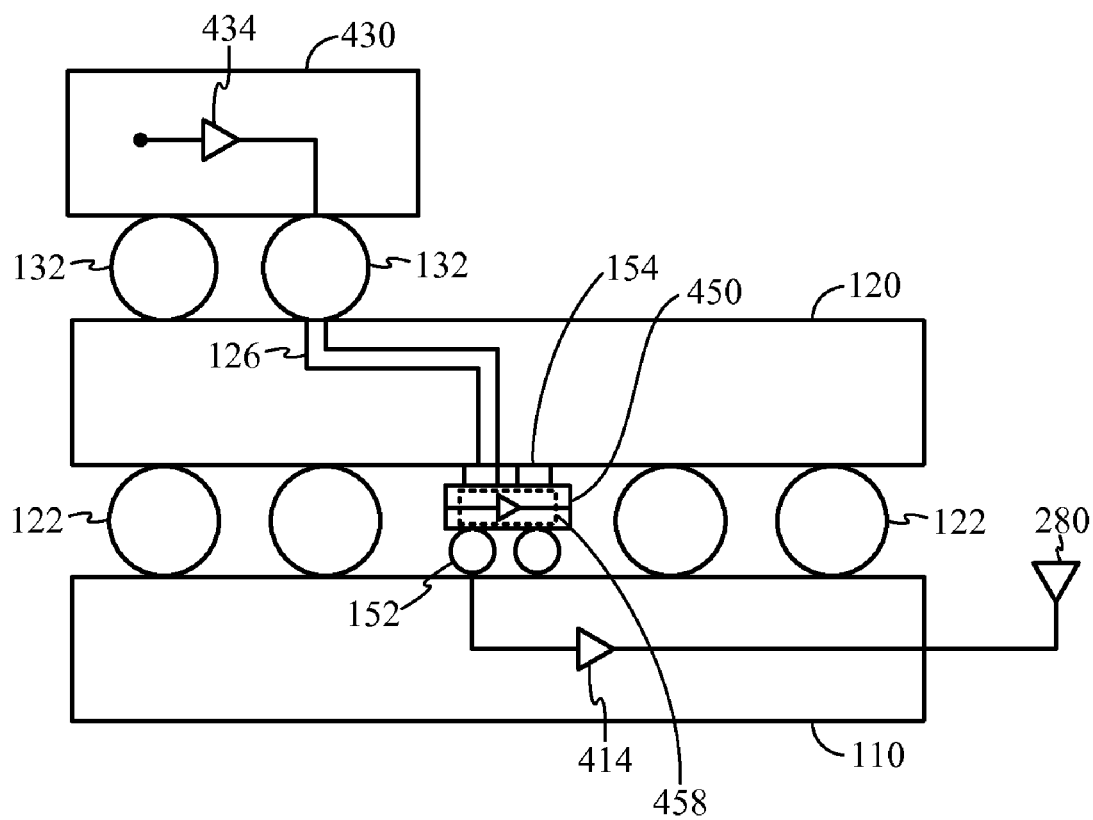
FIG. 4 is a cross-sectional view of an exemplary packaged IC having a semiconductor die-based packaging connection as an I/O buffer according to one embodiment of the disclosure.

According to another embodiment, a semiconductor die-based packaging connection is employed as an I/O buffer between devices in a packaged IC. Microprocessor chip sizes are large and may be several millimeters in length and width. Insertion loss occurs when communicating between one point on the microprocessor and a second point. For example, a 10 V signal at one point may degrade to 9 V when reaching an opposite side of the microprocessor. FIG. 4 is a cross-sectional view of an exemplary packaged IC having a semiconductor die-based packaging connection as an I/O buffer according to one embodiment of the disclosure.

A die 430 includes active circuitry 434 coupled to the packaging connection 132 and the interconnect 126. A semiconductor die-based packaging connection 450 couples the interconnect 126 to circuitry 414 in the system board 110. The circuitry 414 may further be coupled to the antenna 280. To reduce insertion loss, the semiconductor die packaging connection 450 includes an amplifier 458. Alternatively, the semiconductor die packaging connection 450 may include IPDs, IPADs, or MEMS. Reducing insertion loss reduces the amount of power lost in a transmission line.

In any of the embodiments described above, a semiconductor die-based packaging connection may include MEMS devices. For example, a MEMS device may be integrated into a package IC and perform impedance matching or function as an oscillator. Additionally, MEMS devices may be incorporated as a filter, e.g., R ball filters. MEMS devices are enabling devices that improve the overall performance of a packaged IC.

Figure 5:
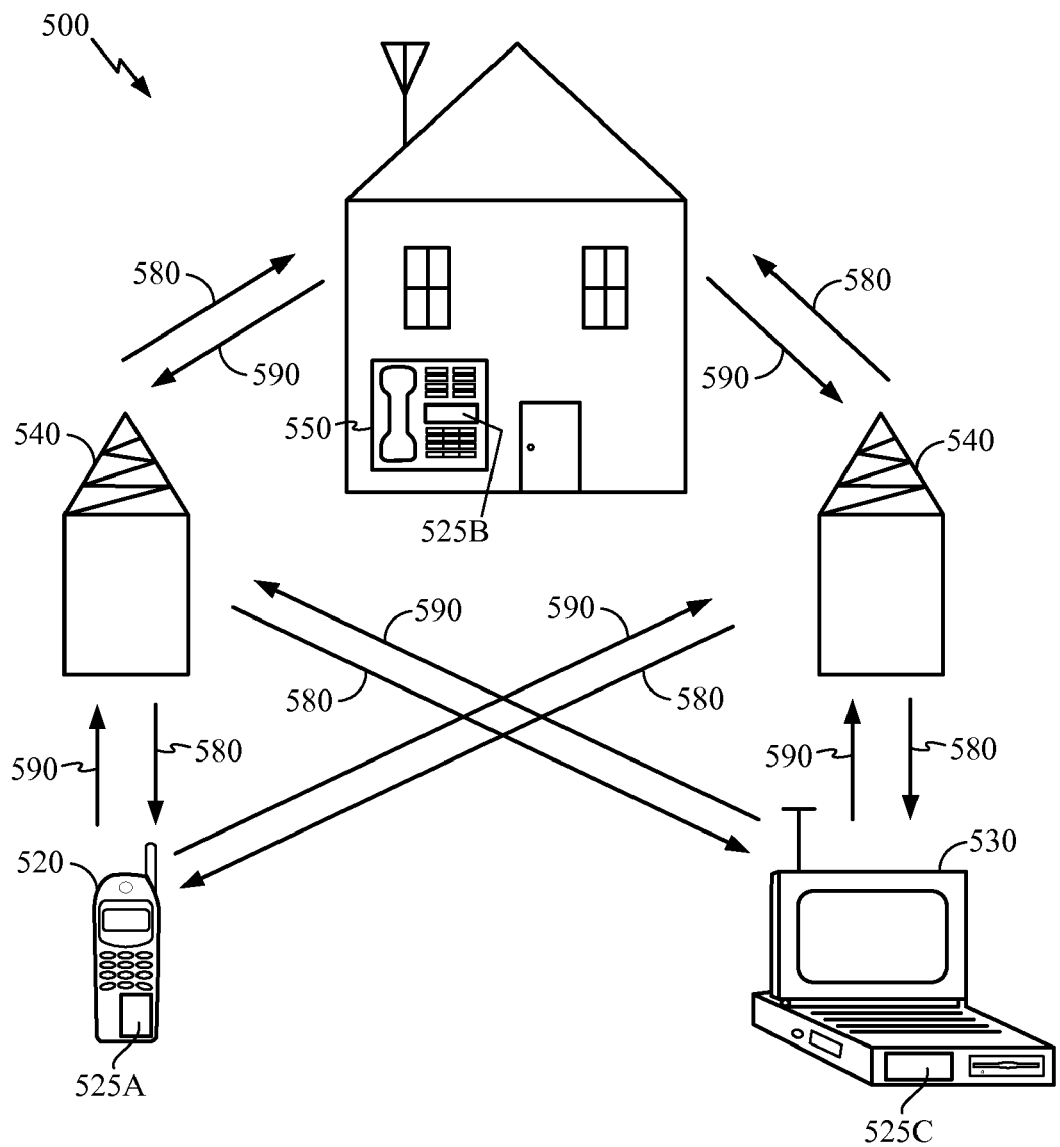
FIG. 5 is a block diagram showing an exemplary wireless communication system in which an embodiment of the invention may be advantageously employed.

A packaged IC as shown above may be implemented in a wireless communication system. FIG. 5 shows an exemplary wireless communication system 500 in which an embodiment of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include improved packaged ICs 525A, 525B, and 525C, respectively, which are embodiments as discussed further below. FIG. 5 shows forward link signals 580 from the base stations 540 and the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a computer in a wireless local loop system. For example, the remote units may be cell phones, hand-held personal communication systems (PCS) units, portable data units such as personal data assistants, or fixed location data units such as meter reading equipment. Although FIG. 5 illustrates remote units according to the teachings of the disclosure, the disclosure is not limited to these exemplary illustrated units. The disclosure may be suitably employed in any device which includes packaged ICs.

Figure 6:
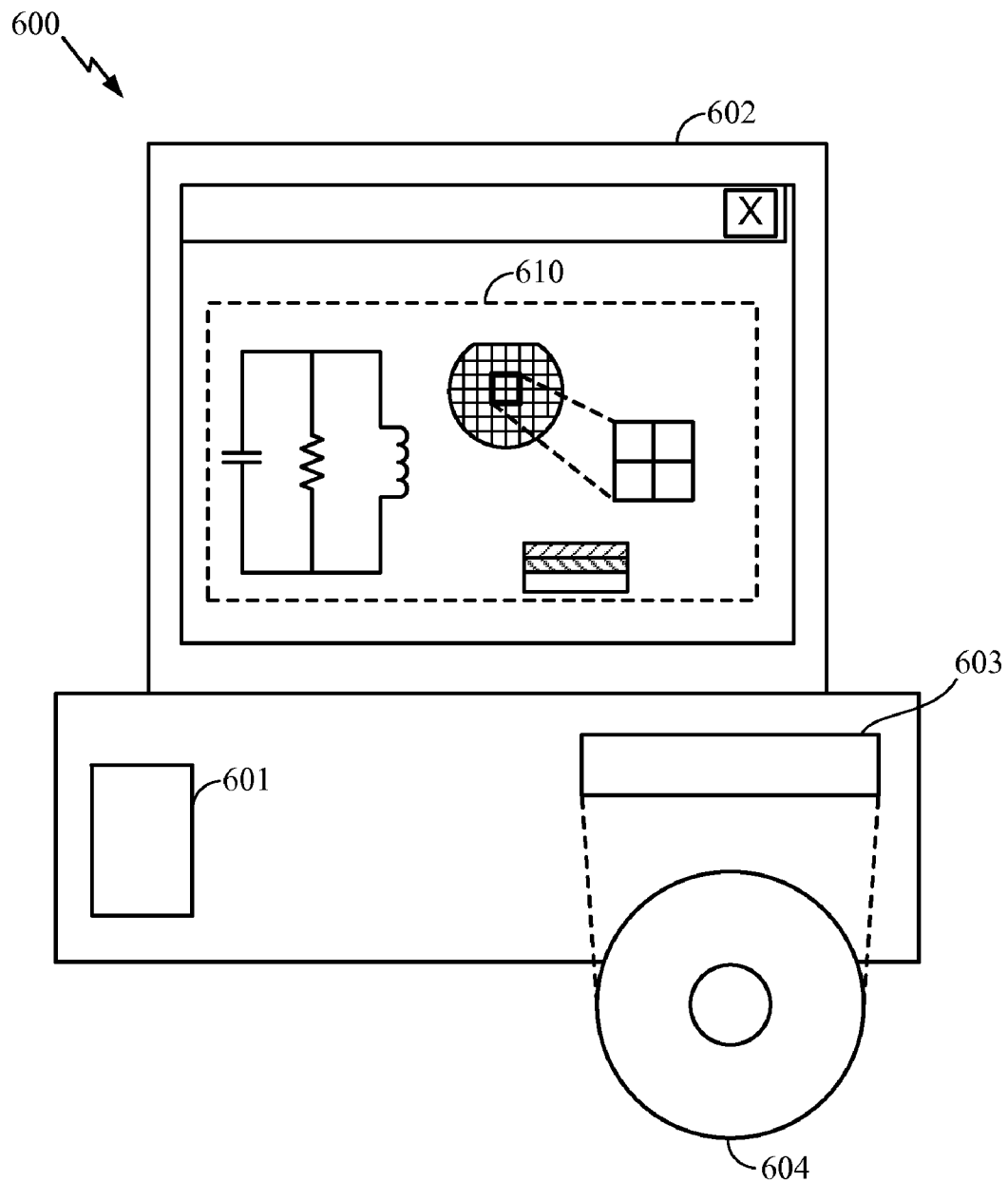
FIG. 6 is a block diagram illustrating a design workstation used for circuit, layout, logic, wafer, die, and layer design of a semiconductor part

FIG. 6 is a block diagram illustrating a design workstation used for circuit, layout, logic, wafer, die, and layer design of a semiconductor part. A design workstation 600 includes a hard disk 601 containing operating system software, support files, and design software such as Cadence or OrCAD. The design workstation 600 also includes a display to facilitate manufacturing of a semiconductor part 610 that may include a packaged IC. A storage medium 604 is provided for tangibly storing the design of the semiconductor part 610. The design of the semiconductor part 610 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the semiconductor part 610 by decreasing the number of processes for manufacturing circuits, semiconductor wafers, semiconductor dies, or layers contained within a packaged IC.

The methodologies described herein may be implemented by various components depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer; disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The semiconductor packages and integrated circuits described herein may contain, in part, memory circuits configured as memory devices, logic circuits configured as microprocessors, or other arrangements of circuitry. The circuitry may be used to support communications devices such as mobile handsets or base stations.

Although the terminology "through silicon via" includes the word silicon, it is noted that through silicon vias are not necessarily constructed in silicon. Rather, the material can be any device substrate material.

Although specific circuitry has been set forth, it will be appreciated by those skilled in the art that not all of the disclosed circuitry is required to practice the invention. Moreover, certain well known circuits have not been described, to maintain focus on the invention.

Although the present invention and its advantages have been described in detail, it should be understood that various changes, substitutions and alterations can be made herein without departing from the technology of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An electronic system comprising:
    a system board;
    a packaging substrate mounted on the system board via a plurality of packaging connections;
    at least one semiconductor die mounted on the packaging substrate, the semiconductor die communicating with the packaging substrate;
    at least one semiconductor die-based packaging interconnect between the system board and the packaging substrate disposed between and within a same layer as the plurality of packaging-connections, the at least one semiconductor die-based packaging interconnect coupled to the system board and the packaging substrate enabling communication between the system board and the packaging substrate; and
    impedance matching circuitry in the at least one semiconductor die-based packaging interconnect the impedance matching circuitry coupled to a radio frequency (RF) device.

2. The system of claim 1, wherein the at least one semiconductor die-based packaging interconnect further comprises at least one through substrate via enabling communication between the system board and the packaging substrate.

3. The system of claim 2, in which the at least one through substrate via is manufactured through a via last process.

4. The system of claim 1, further comprising an integrated passive device in the at least one semiconductor die-based packaging interconnect, an integrated passive active device in the at least one semiconductor die-based packaging interconnect, a MEMS device in the at lease one semiconductor die-based packaging interconnect, and/or a decoupling capacitor in the at least one semiconductor die-based packaging interconnect.

5. The system of claim 1, further comprising
    a voltage supply coupled to the system board, the semiconductor die-based packaging interconnect reducing voltage drop between the voltage supply and the at least one semiconductor die.

6. The system of claim 1, further comprising:
    an antenna coupled to the system board, the at least one semiconductor die-based packaging interconnect matching an impedance between the antenna and the at least one semiconductor die.

7. The system of claim 1, further comprising an amplifier in the at least one semiconductor die-based packaging interconnect.

8. The system of claim 1, in which the at least one semiconductor die-based packaging interconnect reduces insertion loss to the at least one semiconductor die.

9. The system of claim 1, in which the electronic system is integrated into a cell phone, a hand-held personal communication systems (PCS) unit, a portable data unit, and/or a fixed location data unit.

10. A process for manufacturing an e electronic system, comprising:
    depositing a plurality of packaging connections between a system board and a packaging substrate;

depositing at least one semiconductor die-based packaging interconnect on a same layer as and between the plurality of packaging connections;

fabrication impedance matching circuitry within the at east one semiconductor die-based packaging interconnect and coupling the impedance matching circuitry to a radio frequency (RF) device; and coupling a semiconductor die to the packaging substrate with the plurality of packaging connections and the at least one semiconductor die-based packaging interconnect.

11. The process of claim 10, in which depositing the plurality of packaging connections comprises depositing balls of a ball grid array.

12. The process of claim 10, in which depositing the at least one semiconductor die-based packaging interconnect is performed during the same process with depositing the plurality of packaging connections.

13. The process of claim 10, further comprising integrating the electronic system into a cell phone, a hand-held personal communication systems (PCS) unit, a portable data unit, and/or a fixed location data unit.

14. A semiconductor packaging system, comprising:
a system board;
a packaging substrate mounted on the system board;
a plurality of packaging connections coupling the system board and the packaging substrate;
means for interconnecting the packaging substrate and the system board disposed between and within a same layer as the plurality of packaging connections; and
means for match in e lance in the interconnecting means the impedance matching means coupled to a radio frequency (RF) device.

15. The semiconductor packaging system of claim 14, further comprising means for regulating voltage in the interconnecting means, and/or means for reducing insertion loss in the interconnecting means.

16. The semiconductor packaging system of claim 14, in which the semiconductor packaging system is integrated into a cell phone, a hand-held personal communication systems (PCS) unit, a portable data unit, and/or a fixed location data unit.

* * * * *